United States Patent [19]

Hoshino

[11] Patent Number: 5,424,646
[45] Date of Patent: Jun. 13, 1995

[54] RF DRIVE CIRCUIT OF MR APPARATUS
[75] Inventor: Kazuya Hoshino, Tokyo, Japan
[73] Assignee: GE Yokogawa Medical Systems, Limited, Tokyo, Japan
[21] Appl. No.: 211,596
[22] PCT Filed: Oct. 13, 1992
[86] PCT No.: PCT/JP92/01333
   § 371 Date: Apr. 4, 1994
   § 102(e) Date: Apr. 4, 1994
[87] PCT Pub. No.: WO93/07805
   PCT Pub. Date: Apr. 19, 1993
[30] Foreign Application Priority Data
   Oct. 14, 1991 [JP] Japan .................. 3-264733
[51] Int. Cl.$^6$ .............................. G01V 3/00
[52] U.S. Cl. ........................ 324/322; 324/318
[58] Field of Search ........... 324/322, 318, 307, 309, 324/314; 128/653.5

[56] References Cited
U.S. PATENT DOCUMENTS 4,763,074 8/1988 Fox .................................. 324/322
4,777,440 10/1988 Van Heelsbergen .............. 324/322
5,051,700 9/1991 Fox .................................. 324/322
5,166,620 11/1992 Panosh ............................ 324/322

FOREIGN PATENT DOCUMENTS
63-296737 5/1987 Japan.

Primary Examiner—Louis Arana
Attorney, Agent, or Firm—Moonray Kojima

[57] ABSTRACT

This invention provides an RF drive circuit of MR apparatus capable of controlling the drive voltage of the RF coil, inclusive of the correction of the quadrature balance. The RF drive circuit for quadratically driving the RF coil of MR apparatus comprises a voltage monitor means for monitoring the voltages on the 0°-port and 90°-port of the RF coil, a feedback voltage generation means for producing, from the monitored voltages on the 0°-port and 90°-port, a feedback voltage that corresponds to a component of a revolving magnetic field formed in the RF coil, with the magnetic field component being in the field revolving direction and coupling with a spin system, and a drive voltage control means for controlling, based on the feedback voltage, the drive voltage to be applied to the RF coil.

5 Claims, 3 Drawing Sheets

RF DRIVE CIRCUIT OF MR APPARATUS

TECHNICAL FIELD

The present invention relates to an RF drive circuit used in MR apparatus, and more particularly to an RF drive circuit capable of maintaining a prescribed amplitude of the spin-inducing RF revolving magnetic field regardless of the load impedance.

BACKGROUND ART

FIG. 5 shows an example of conventional RF drive circuit of MR apparatus. The RF drive circuit 51 has its input terminal IN supplied with an RF pulse signal having a prescribed envelope. The RF pulse signal is conducted through a distributor 2 and fed to a variable-gain amplifier 3. The variable-gain amplifier 3 operates in unison with a power amplifier 4 to amplify the RF pulse signal to produce a drive voltage of a prescribed voltage level, which is fed to a quadrature hybrid 5. The quadrature hybrid 5 produces a 0°-component drive voltage and a 90°-component drive voltage from the input drive voltage, and applies the resulting drive voltages to a 0°-port and 90°-port of an RF coil 6. By being energized by the two-component drive voltages, the RF coil 6 generates an RF revolving magnetic field in its internal space.

A voltage monitor means 52 monitors the output voltage of the power amplifier 4 and feeds the result to an envelope extracting circuit 53, which extracts the envelope of the monitored device voltage. Another envelope extracting circuit 11 connected to the distributor 2 extracts the envelope of the RF pulse signal provided by the distributor 2.

A comparator 12 compares the envelopes of the RF pulse signal and output voltage of the power amplifier 4, and controls the gain of the variable-gain amplifier 3 in accordance with the comparison result so that the output voltage of the power amplifier 4 has the prescribed value regardless of the load condition of the coil (the impedance of the patient who lies in the internal space of the RF coil 6).

The foregoing conventional RF drive circuit 51 merely controls the output voltage of the power amplifier 4 to the prescribed level, but it does not control the balance of the voltages applied to the 0°-port and 90°-port of the RF coil 6. Therefore, if the RF coil 6 loses the impedance balance due to different impedances of the 0°-port and 90°-port, the quadrature balance, i.e., the condition of RF revolving magnetic field generation, varies, resulting in a varying flip angle for spin induction.

DISCLOSURE OF THE INVENTION

Accordingly, an object of the present invention is to provide an RF drive circuit of MR apparatus capable of controlling the drive voltage of the RF coil, inclusive of the correction of the quadrature balance.

The invention resides in an RF drive circuit for quadratically driving the RF coil of MR apparatus, and it comprises a voltage monitor means for monitoring the voltages on the 0°-port and 90°-port of the RF coil, a feedback voltage generation means for producing, from the monitored voltages on the 0°-port and 90°-port, a feedback voltage that corresponds to a component of a revolving magnetic field formed in the RF coil, with the magnetic field component being in the field revolving direction and coupling with a spin system, and a drive voltage control means for controlling, based on the feedback voltage, the drive voltage to be applied to the RF coil.

The inventive RF drive circuit of MR apparatus operates to monitor the voltages on the 0°-port and 90°-port of the RF coil, produce a feedback voltage that corresponds to the component, which is along the field revolving direction and couples with the spin system, of the revolving magnetic field formed in the RF coil, and control the drive voltage to be applied to the RF coil based on the feedback voltage. Consequently, even if the RF coil loses the impedance balance of the 0°-port and 90°-port, the imbalance is corrected automatically and the RF magnetic field that contributes to the spin induction can be stabilized.

BEST MODE FOR CARRYING OUT THE INVENTION

The embodiments of the present invention will be explained in detail with reference to the drawings. It should be noted, however, that the invention is not confined to these embodiments.

Figure 1:
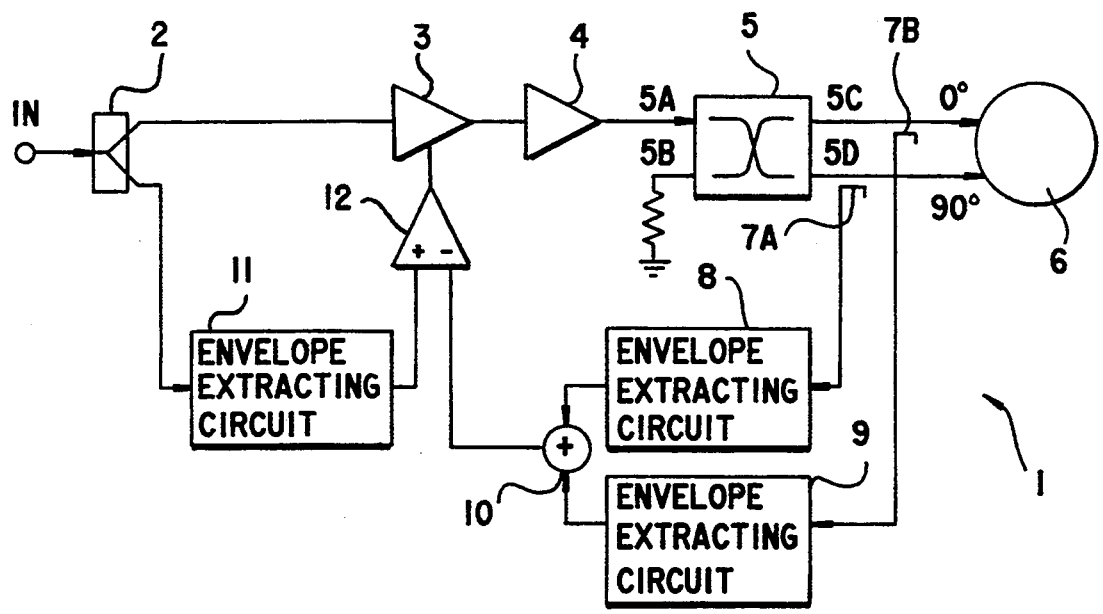
FIG. 1 is a block diagram of the RF drive circuit based on an embodiment of this invention.

FIG. 1 is a block diagram of the RF drive circuit of MR apparatus based on an embodiment of this invention.

The RF drive circuit 1 has its input terminal IN supplied with an RF pulse signal having a prescribed envelope. The RF pulse signal is conducted through a distributor 2 and fed to a variable-gain amplifier 3. The variable-gain amplifier 3 operates in unison with a power amplifier 4 to amplify the RF pulse signal to produce a drive voltage of a prescribed voltage level, which is fed to a quadrature hybrid 5. The quadrature hybrid 5 produces a 0°-component drive voltage and a 90°-component drive voltage from the input drive voltage, and applies the resulting drive voltages to a 0°-port and 90°-port of an RF coil 6. The arrangement up to this point is identical to the conventional one shown in FIG. 5.

A voltage monitor 7A monitors the voltage on the 90°-port and feeds the result to an envelope extracting circuit 8, and another voltage monitor 7B monitors the voltage on the 0°-port and feeds the result to another envelope extracting circuit 9. The envelope extracting circuits 8 and 9 extract the envelopes of the voltages on the 0°-port and 90°-port of the RF coil 6, and feed them to an adder 10. The adder 10 sums the voltage envelopes of the 0°-port and 90°-port of the RF coil 6, and feeds the result to a comparator 12. Another envelope extracting circuit 11 connected to the distributor 2 extracts the envelope of the RF pulse signal provided by the distributor 2 and feeds it to the comparator 12.

The comparator 12 compares the envelopes of the RF pulse signal and output voltage of the power amplifier 4, and controls the gain of the variable-gain amplifier 3 in accordance with the comparison result so that the sum of the envelopes derived from the 0°-port and 90°-port of the RF coil 6 has the prescribed value regardless of the load condition of the coil (the impedance of the patient under test).

Figure 2:
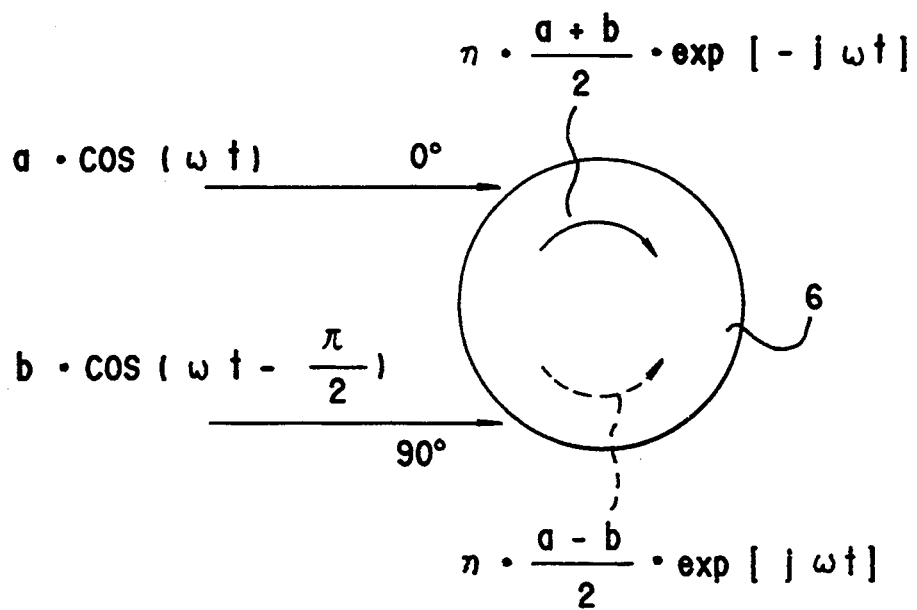
FIG. 2 is a diagram explaining a revolving magnetic field.

Next, the principle of operation of the foregoing RF drive circuit of MR apparatus will be explained with reference to FIG. 2.

The RF coil 6 having the application of a voltage a·cos($\omega t$) to the 0°-port and a voltage b·cos($\omega t + \pi/2$) to the 90°-port produces an RF revolving magnetic field that is expressed as follows.

$$\eta \cdot a \cdot \cos(\omega t) + \eta \cdot b \cdot \cos(\omega t - \pi/2) = \quad (1)$$
$$\eta[\{(a+b)/2\}\exp[-j\omega t]] + \eta[\{(a-b)/2\}\exp[j\omega t]]$$

where $\eta$ is the amplitude factor of the generated magnetic field per unit voltage, and a and b are arguments that vary in response to the variation of impedance of the patient under test.

The magnetic field consists of a forward revolving magnetic field expressed by the first term on the right-hand side of the formula and a reverse revolving magnetic field expressed by the second term. The forward revolving magnetic field couples with the spin system in the usual MR apparatus.

Figure 5:
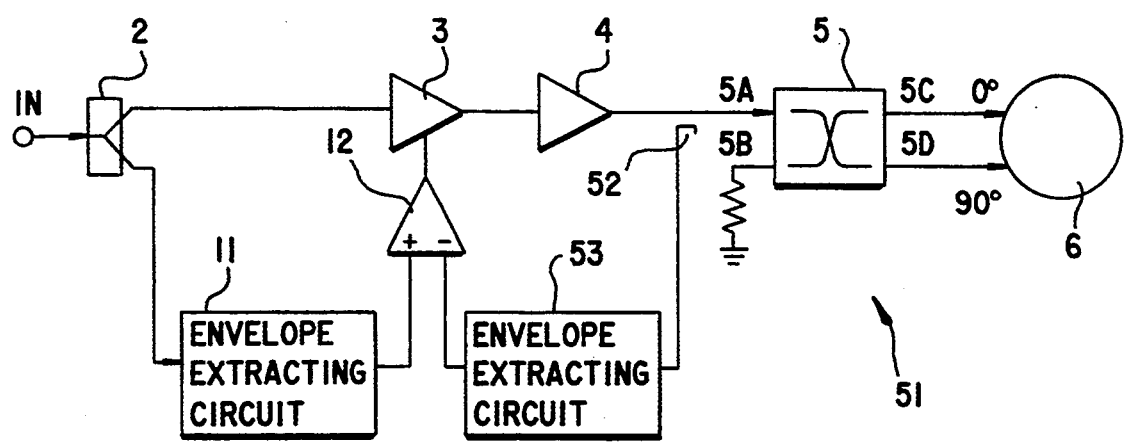
FIG. 5 is a block diagram showing an example of a conventional RF drive circuit of MR apparatus.

If the quadrature balance is always perfect, in which case the arguments a and b are equal and the reverse revolving magnetic field does not emerge, the conventional control circuit shown in FIG. 5 works satisfactorily. However, once the quadrature balance is lost due to the variation of the impedance of the patient, in which case the arguments a and b are unequal and the reverse revolving magnetic field emerges, the control circuit of FIG. 5 develops an error of flip angle due to the degraded efficiency of the quadrature.

In contrast, the inventive RF drive circuit 1 shown in FIG. 1 is designed to extract the envelopes a and b from the voltages on the 0°-port and 90°-port of the RF coil 6, feed the sum (a+b) as a feedback voltage to the comparator 12, and control the gain of the variable-gain amplifier 3 so that the summed envelope (a+b) coincides with the envelope of the input RF pulse signal even if the quadrature balance is lost. Consequently, the amplitude of the spin-inducing RF revolving magnetic field is maintained properly regardless of the patient under test and the flip angle can be maintained at the prescribed value.

Figure 3:
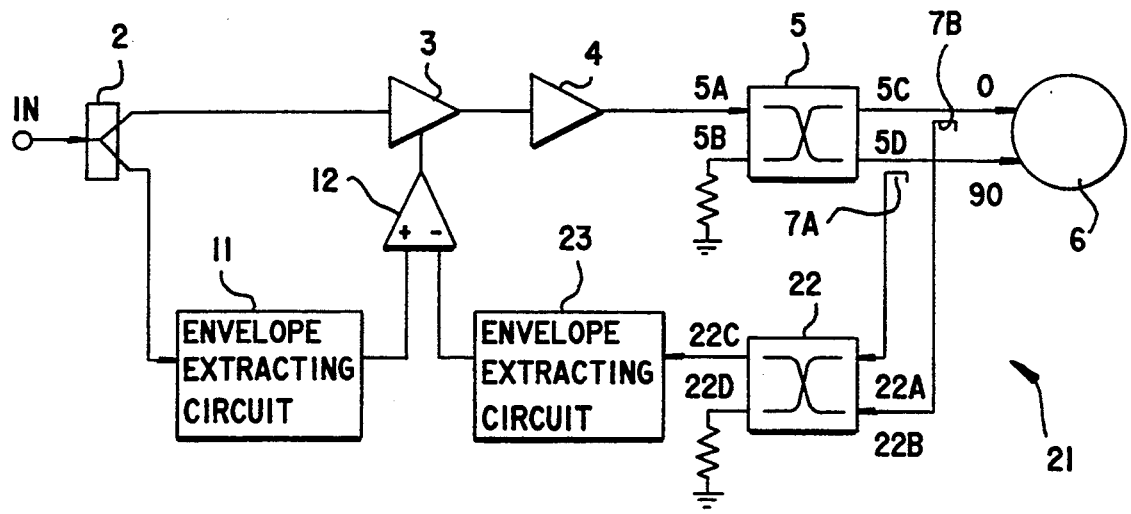
FIG. 3 is a block diagram of the RF drive circuit based on another embodiment of this invention.

FIG. 3 is a block diagram of the RF drive circuit based on another embodiment of this invention. The RF drive circuit 21 differs from the circuit 1 of FIG. 1 in the employment of an additional quadrature hybrid 22 and other envelope extracting circuit 23 in place of the envelope extracting circuits 8 and 9 and the adder 10.

Figure 4:
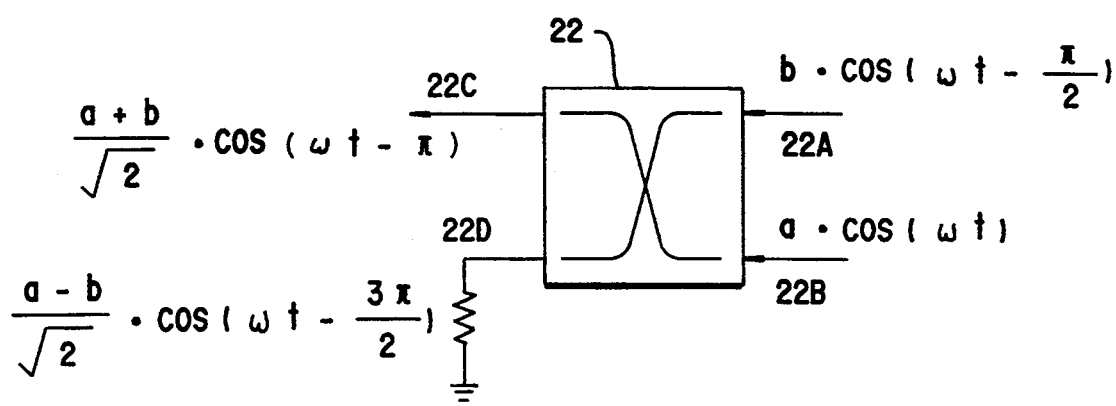
FIG. 4 is a diagram used to explain the operation of the quadrature hybrid shown in FIG. 3.

In response to the application of a voltage b·cos($\omega t - \eta/2$) to the 90°-port and a voltage a·cos($\omega t$) to the 0°-port of the RF coil 6, the quadrature hybrid 22 produces the following outputs as shown in FIG. 4.

$$\frac{a+b}{\sqrt{2}} \cdot \cos(\omega t - \pi) \quad (2)$$

$$\frac{a-b}{\sqrt{2}} \cdot \cos\left(\omega t - \frac{3\pi}{2}\right) \quad (3)$$

Accordingly, a feedback voltage that is proportional to a+b is obtained from the envelope of output voltage expressed by the above formula (2). Consequently, it is possible based on the RF drive circuit 21 to maintain properly the amplitude of the spin-inducing RF revolving magnetic field regardless of the patient under test.

The RF drive circuit 21 using the quadrature hybrid 22 is advantageous for coping with the degraded quadrature efficiency attributable to the displacement of orthogonality between the voltages on the 0°-port and 90°-port of the RF coil 6.

As a variant embodiment, the quadrature hybrid 22 in FIG. 3 may be replaced with a phase shifter and a 0°-hybrid.

According to the inventive RF drive circuit of MR apparatus, it is possible to maintain properly the amplitude of the spin-inducing RF revolving magnetic field, inclusive of the correction of the quadrature balance.

I claim:

1. An RF drive circuit for quadratically driving the RF coil of MR apparatus, said circuit comprising: a voltage monitor means for monitoring the voltages on the 0°-port and 90°-port of said RF coil; a feedback voltage generation means for producing, from the monitored voltages on the 0°-port and 90°-port, a feedback voltage that corresponds to a component of a revolving magnetic field formed in said RF coil, said magnetic field component being in the field revolving direction and coupling with a spin system; and a drive voltage control means for controlling, based on the feedback voltage, the drive voltage to be applied to said RF coil.

2. The circuit of claim 1, wherein said feedback generation means comprises envelope extraction means (8,9) for extracting envelopes from outputs from said voltage monitoring means; and adder means (10) for adding together outputs from said envelope extraction means.

3. The circuit of claim 2, wherein said voltage control means comprises comparator means (12) for comparing outputs from said adder means and a signal from an input.

4. The circuit of claim 1, wherein said feedback generation means comprises quadrature hybrid means (22) and envelope extraction means (23).

5. The circuit of claim 4, wherein said voltage control means comprises comparator means (12) for comparing output from said envelope extraction means and a signal from an input.

* * * * *